(12) United States Patent
Choi et al.

(10) Patent No.: US 6,262,940 B1
(45) Date of Patent: Jul. 17, 2001

(54) SEMICONDUCTOR MEMORY DEVICE AND METHOD FOR IMPROVING THE TRANSMISSION DATA RATE OF A DATA INPUT AND OUTPUT BUS AND MEMORY MODULE

(75) Inventors: Hoon Choi, Seoul; Sei-jin Kim, Kyungki-do, both of (KR); Taketo Maesako, Tokyo (JP)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/543,758

(22) Filed: Apr. 5, 2000

(30) Foreign Application Priority Data

Apr. 7, 1999 (KR) .................................. 99-12028

(51) Int. Cl.$^7$ ...................................... G11C 8/00
(52) U.S. Cl. ................ 365/233; 365/230.03; 365/230.04
(58) Field of Search .................................. 365/233, 239, 365/230.03, 230.04; 710/60; 713/500, 501

(56) References Cited

U.S. PATENT DOCUMENTS

| | | | |
|---|---|---|---|
| 5,327,391 | * 7/1994 | Hirata ................... | 365/233 |
| 5,455,802 | * 10/1995 | McClure ................ | 365/233 |
| 5,577,236 | 11/1996 | Johnson et al. ....... | 395/551 |
| 5,646,904 | * 7/1997 | Ohno et al. ............ | 365/233 |
| 5,768,213 | * 6/1998 | Jung et al. ............. | 365/233 |
| 5,771,199 | * 6/1998 | Lee . | |
| 5,867,448 | * 2/1999 | Mann . | |
| 5,953,286 | * 9/1999 | Matsubara et al. .... | 365/233 |
| 6,021,077 | * 2/2000 | Nakaoka ............... | 365/233 |
| 6,078,546 | * 6/2000 | Lee ........................ | 365/233 |
| 6,115,318 | * 9/2000 | Keeth ..................... | 365/233 |
| 6,118,729 | * 9/2000 | Hirabayashi et al. .. | 365/233 |

* cited by examiner

*Primary Examiner*—Tan T. Nguyen
(74) *Attorney, Agent, or Firm*—Jones Volentine, L.L.C.

(57) ABSTRACT

A semiconductor memory device for improving the transmission data rate of a data input and output bus, and a memory module including the same, are provided. The memory module includes a plurality of clock synchronous memory devices that share a single data bus line. More specifically, the memory module includes a printed circuit board having an electrical connector including the data bus line, a first set of synchronous memory devices arrayed on the printed circuit board, a second set of synchronous memory devices arrayed on the print circuit board, and a clock signal generator electrically connected to the first and second set of synchronous memory devices. The clock signal generator operates to receive a clock signal from the electrical connector and to generate a first clock signal that is matched with the received clock signal and a second clock signal that is delayed with respect to the received clock signal for half the period of the received clock signal. In the memory module, memory data in the first set and memory data in the second set are alternately output to the data bus line.

12 Claims, 2 Drawing Sheets

SEMICONDUCTOR MEMORY DEVICE AND METHOD FOR IMPROVING THE TRANSMISSION DATA RATE OF A DATA INPUT AND OUTPUT BUS AND MEMORY MODULE

This application relies for priority upon Korean Patent Application No. 99-12028, filed on Apr. 7, 1999, the contents of which are herein incorporated by reference in their entirety.

BACKGROUND OF THE INVENTION

The present invention relates to memory hardware, and more particularly, to a semiconductor memory device for improving the transmission data rate of a data input and output bus, and a memory module including such a device.

Memory modules are circuit boards designed to mount memory chips. Generally, memory modules are easily inserted into and extracted from a connector within the computer system. Memory modules are driven by being connected to all necessary power sources, ground power sources, and logic signals.

Memory modules typically include a plurality of RAM chips mounted on a print circuit board. DRAM, SRAM, or video RAM can be used in various applications depending on the requirements. DRAMs are generally cheaper and have a larger capacity than SRAMs, so that they have been widely used as essential elements such as the main memory of computer systems. SRAM and video RAM modules are more restricted in use and so they are respectively applied to special purposes such as for a cache memory or for a video frame buffer.

Many techniques are used for fast operation of a DRAM. For example, fast access modes such as page mode, a static column mode, and a nibble mode are used. Characteristics such as enhanced DRAMs or RAMBUS DRAMs are also used. Accordingly, memory modules using various different RAM memories are required to improve the bandwidth of a memory, i.e., the speed of information that can be exchanged with a memory.

The appearance of synchronous DRAMs (SDRAMs) is one of the newest and the most important improvements in the area of memory access speed and bandwidth. SDRAMs are different from asynchronous DRAMs in that they operate in synchronization with a clock signal. Typically, SDRAMs have predetermined sections where data read from a memory is effective. Data is essentially read in response to a clock signal combined with a read command provided to SDRAMs. In other words, SDRAMs output the effective data of a memory cell after a read command is issued, and maintain the data throughout a predetermined period. This predetermined period is called "valid data window." Thus, the SDRAMs provide data within the valid data window in accordance with a continuous clock signal. A method of reading data from a module including an SDRAM has been disclosed in U.S. Pat. No. 5,577,236, the contents of which are hereby incorporated by reference in their entirety.

According to this U.S. patent, when data is read from a memory bank of an SDRAM, a memory controller provides an optimal clock signal to compensate for the delay of read data due to a line load and a process variation upon manufacture of chips and cards. SDRAMs perform reading/writing operations in accordance with the rising edge of the optimal clock signal. This means that memory cell data is read from an SDRAM and transferred to a data input and output bus during one cycle of a clock signal provided to the SDRAM.

As a result, the transmission data rate of the data input and output bus is defined by a clock cycle in the U.S. Pat. No. 5,577,236. In other words, the transmission data rate of the data input and output bus is determined according to the operation of a single data rate SDRAM (SDR SDRAM). Therefore, the transmission data rate described above is not sufficient to satisfy the operation of a memory module that requires a data input and output bus having a high data rate.

SUMMARY OF THE INVENTION

To solve the above problem, it is an object of the present invention to provide a semiconductor memory device by which the transmission data rate of a data input and output bus is improved.

It is another object of the present invention to provide a memory module having such a semiconductor memory device.

Accordingly, to achieve the first object, the present invention provides a semiconductor memory device that comprises a data bus line, a clock signal generator for receiving a system clock signal and generating first and second clock signals, a first set of synchronous memory devices connected to the data bus line for outputting first memory cell data to the data bus line in synchronization with the first clock signal, and a second set of clock synchronous memory devices connected to the data bus line for outputting second memory cell data to the data bus line in synchronization with the second clock signal.

Preferably the first and second clock signals are generated such that the first and second set of synchronous memory devices are not connected to the data bus line at the same time. Also, the first clock signal is preferably substantially identical to the system clock signal, and the second clock signal is preferably delayed by a predetermined time interval with respect to the system clock signal. The second clock signal is preferably delayed by a predetermined time interval such that the second clock signal it is the inverse of the system clock signal.

The first and second sets of synchronous memory devices preferably have a valid data window that is smaller than the predetermined time interval.

The semiconductor memory device may further comprise an address/command driver for providing address and command signals to the first and second sets of synchronous memory devices.

To achieve the second object, the present invention provides a memory module that comprises a printed circuit board having an electrical connector including a data bus line, a first set of synchronous memory devices arranged on the printed circuit board and connected to the data bus line, a second set of synchronous memory devices arranged on the print circuit board and connected to the data bus line, and a clock signal generator electrically connected to the first and second set of synchronous memory devices, for receiving a system clock signal from the electrical connector and generating a first clock signal and a second clock signal. The first memory data in the first set of synchronous memory devices and second memory data in the second set of synchronous memory devices are alternately output to the data bus line.

The first clock signal is preferably matched with the received clock signal, while the second clock signal is preferably delayed with respect to the received clock signal for half the period of the received clock signal.

The memory module may further comprise an address/command driver connected to a first and second sets of synchronous memory devices, for receiving a memory address of one of the first or second set of synchronous memory devices and a command for directing an operation mode of the one of the first or second set of synchronous memory devices, from the electrical connector. The address/command driver preferably starts activating the memory devices before the first and second clock signals are generated.

The synchronous memory devices preferably have a valid data window that is smaller than half the period of the clock signal. The synchronous memory devices preferably enlarge the main memory of the memory module, and increase the data bandwidth of the memory module.

As described above, the present invention includes SDRAM sets which synchronize with a plurality of clocks, respectively, thus improving the transmission data rate of a data input and output bus and the bandwidth of a memory module.

BRIEF DESCRIPTION OF THE DRAWINGS

The above objects and advantage of the present invention will become more apparent by describing in detail a preferred embodiment thereof with reference to the attached drawings in which.

DESCRIPTION OF THE PREFERRED EMBODIMENT

Figure 1:
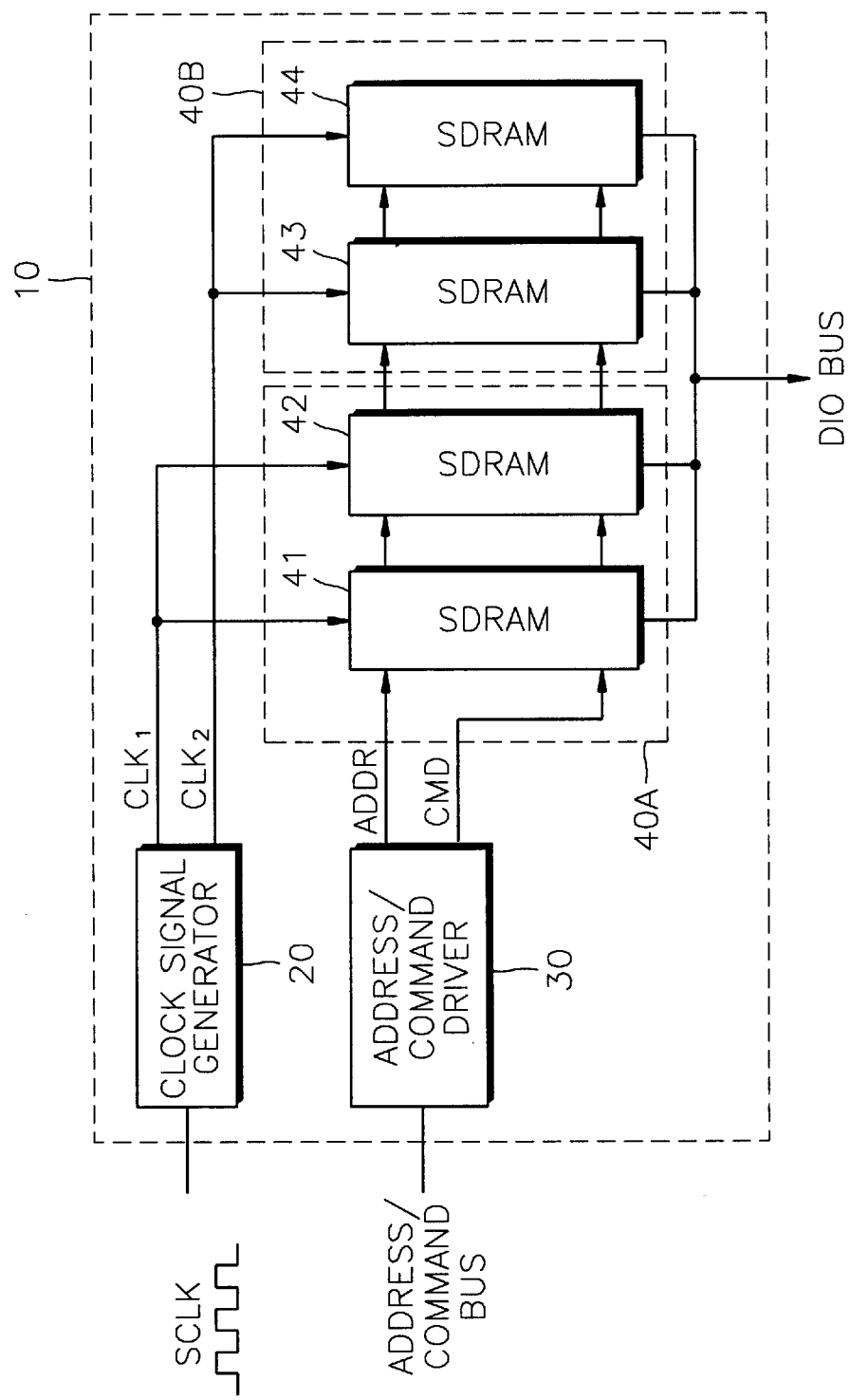
FIG. 1 is a block diagram illustrating a memory module according to a preferred embodiment of the present invention.

The attached drawings illustrate a preferred embodiment of the present invention. The following description sets forth the merits of the present invention and its operation, as well as the objectives accomplished by the operation of the present invention.

Hereinafter, the present invention will be described in detail by explaining the preferred embodiment of the present invention with reference to the attached drawings. Like reference numerals in the drawings denote the same members.

FIG. 1 is a block diagram illustrating a memory module including a semiconductor memory device according to the preferred embodiment of the present invention. Referring to FIG. 1, a memory module 10 includes a clock signal generator 20, an address/command driver 30, and a plurality of SDRAMs 41, 42, 43, and 44. The number of SDRAMs 41, 42, 43, and 44 determines the overall size of the memory module 10. Accordingly, the number of SDRAMs 41, 42, 43, and 44 can vary according to the devices memory size. The present specification employs four SDRAMs, and so includes first through fourth SDRAMs 41, 42, 43, and 44, by way of example.

The clock signal generator 20 externally receives a system clock signal SCLK via an electrical connector (not shown) and generates first and second clock signals $CLK_1$ and $CLK_2$. The first clock signal $CLK_1$ is preferably matched with the system clock signal SCLK, and the second clock signal $CLK_2$ is preferably inverted with respect to the system clock signal SCLK. The first and second clock signals $CLK_1$ and $CLK_2$ act as main clock signals for the SDRAMs 41, 42, 43, and 44, as described later. In addition, the second clock signal $CLK_2$ can be a delay signal delayed by a predetermined time interval on the basis of the system clock signal SCLK as well as being a signal inverted with respect to the system clock signal SCLK.

The address/command driver 30 decodes the addresses of the SDRAMs 41, 42, 43, and 44 and of memory cells within the SDRAMs 41, 42, 43, and 44, as well as the addresses received via an address/command bus. The address/command driver 30 then selects an SDRAM from the plurality of SDRAMs 41, 42, 43 and 44, and generates a cell address signal ADDR for selecting the memory cells within the selected SDRAMs 41, 42, 43, or 44. The address/command driver 30 generates a command signal CMD obtained by multiplexing operation commands received via the address/command bus. The operation commands may, for example, be a read command and a write command.

The address signal ADDR and the command signal CMD are preferably provided to the SDRAMs 41, 42, 43, and 44 before the first and second clock signals $CLK_1$ and $CLK_2$ are provided to the SDRAMs 41, 42, 43, and 44, thus starting the activation of the SDRAMs 41, 42, 43, and 44. The addresses and commands received via the address/command bus are preferably received from a microprocessor, a system card, or electrical device connected to the memory module 10 within computer system equipment. For example, the command signal CMD may be comprised of a signal group of /CS, /RAS, /CAS, and /WE signals.

The SDRAMs 41, 42, 43 and 44 are preferably grouped into a first memory set 40A and a second memory set 40B. The first memory set 40A is an SDRAM group that preferably operates in synchronization with the first clock signal $CLK_1$, and the second memory set 40B is a SDRAM group that preferably operates in synchronization with a second clock signal $CLK_2$. The first and second SDRAMs 41 and 42 in the first memory set 40A perform operations corresponding to a cell address signal ADDR and a command signal CMD at the moment that they synchronize with the first clock signal $CLK_1$. In this way, the first and second SDRAMs 41 and 42 in the first memory set 40A read memory cell data from memory cells of the first memory set 40A and output it to a data input and output bus DIO BUS, or write data from the data input and output bus DIO BUS to memory cells of the first memory set 40A.

The third and fourth SDRAMs 43 and 44 in the second memory set 40B perform operations corresponding to a cell address signal ADDR and a command signal CMD at the moment that they synchronize with the second clock signal $CLK_2$. In this way, the third and fourth SDRAMs 43 and 44 in the second memory set 40B read memory cell data from the memory cells of the second memory set 40B and output it to the data input and output bus DIO BUS, or write data from the data input and output bus DIO BUS to memory cells of the second memory set 40B.

The data input and output bus DIO BUS is shared by the first and second memory sets 40A and 40B when the memory cell data is read. Data of the first memory set 40A synchronized with the first clock signal $CLK_1$ and data of the second memory set 40B synchronized with the second clock signal $CLK_2$ are preferably transferred alternately on the data input and output bus DIO BUS. An operational timing diagram for the memory module 10 explaining the above process is shown in FIG. 2.

Figure 2:
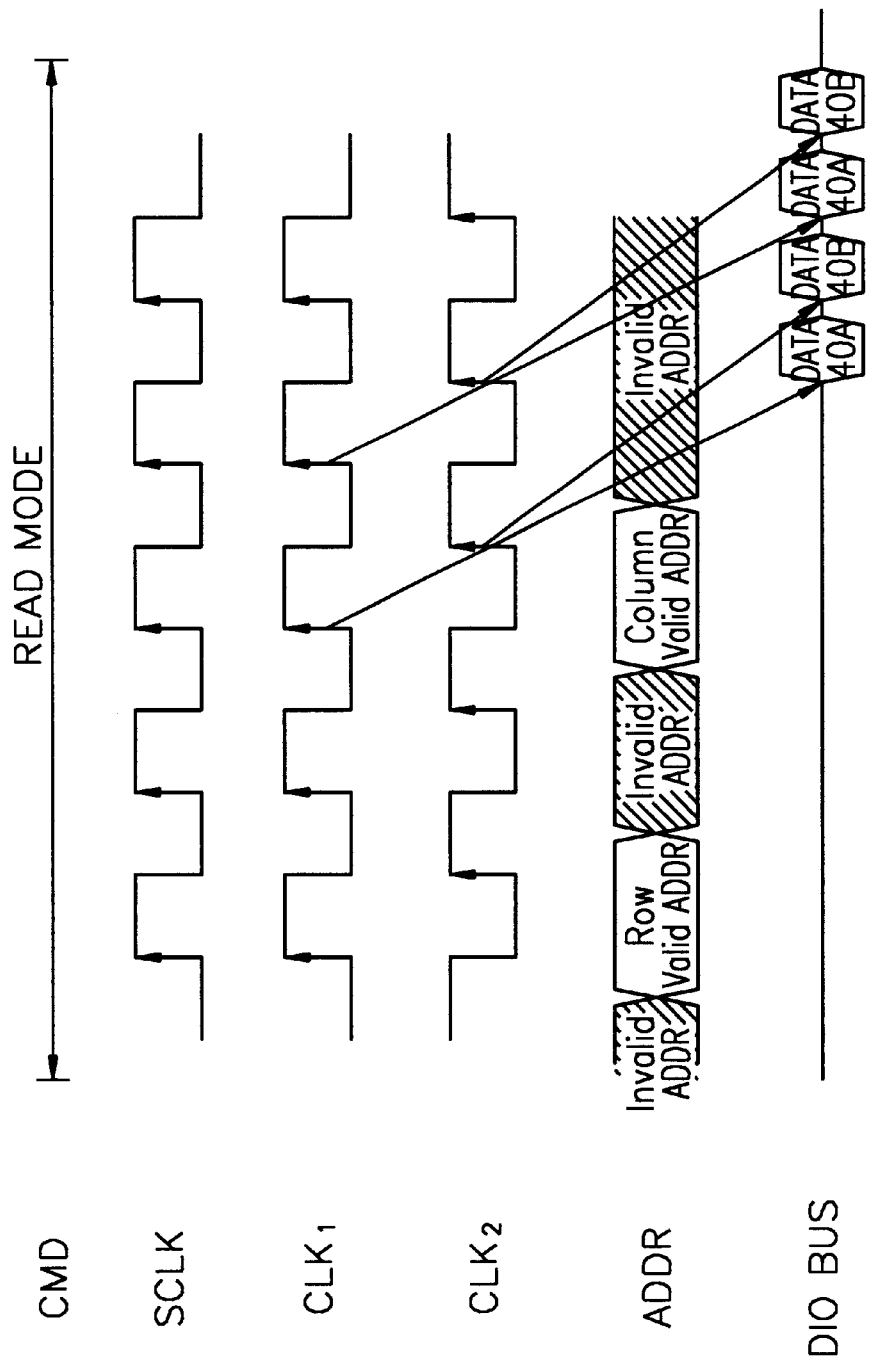
FIG. 2 is an operation timing diagram for FIG. 1.

Referring to FIG. 2, the system clock signal SCLK is periodically received in a square wave shape. In the preferred embodiment, the first clock signal $CLK_1$ is generated by the clock signal generator 20 such that it is matched with the system clock signal SCLK, and the second clock signal $CLK_2$ is generated by the clock signal generator 20 such that it is inverted with respect to the system clock signal SCLK. The command signal CMD is then provided by the command driver 30 as a read mode for directing the reading of memory cell data. A row valid address is applied to the memory sets 40A and 40B in synchronization with the next rising edge of the system clock signal SCLK.

Data is then loaded on the data input and output bus DIO BUS in a sequence of the memory cell data corresponding to the row valid address and the column valid address from the memory sets 40A and 40B. In other words, at a rising edge of the first clock signal $CLK_1$, memory cell data of the first memory set 40A is loaded onto the data input and output bus DIO BUS. Then, at a rising edge of the second clock signal $CLK_2$, which is equal to the falling edge of the first clock signal $CLK_1$, memory cell data of the second memory set 40B is loaded onto the data input and output bus DIO BUS.

After the memory cell data of memory sets 40A and 40B is loaded alternately on the data input and output bus DIO BUS during one cycle of the first clock signal $CLK_1$, a number of memory cell data of memory sets 40A and 40B that correspond to the burst length are loaded alternately on the data input and output bus DIO BUS. This scheme of memory cell data can be easily realized by one of ordinary skill in the art. The burst length may be varied, but in this preferred embodiment, the burst length is 2

Generally, an SDRAM outputs memory cell data within a "valid data window." The SDRAMs 41, 42, 43 and 44 in this embodiment must be set so as to have a valid data window having a period smaller than the half period of the system clock signal SCLK, because the second clock signal $CLK_2$ is delayed by the half period of the system clock signal SCLK. Thus, the valid data window of the SDRAMs 41, 42, 43 and 44 is preferably set so that it is shorter than a predetermined delay time interval with respect to the system clock signal SCLK. In this way, collision of memory cell data in the data input and output bus DIO BUS is prevented.

As a result, in the memory module 10 (see FIG. 1) according to the preferred embodiment of the present invention, memory cell data from the first and second memory sets 40A and 40B are carried by the data input and output bus DIO BUS during one cycle of the system clock signal SCLK. This has the effect of doubling the data rate of the data input and output bus DIO BUS compared to when memory cell data from only one SDRAM is transferred on the data input and output bus DIO BUS during one cycle of a system clock signal SCLK in the prior art. This effect illustrates that the function of a dual data rate SDRAM can be accomplished by single data rate SDRAMs.

Also, in the memory module 10 of FIG. 1 according to the preferred embodiment of the present invention, a plurality of SDRAM sets respectively synchronized with a plurality of delay clock signals exist when the plurality of delay clock signals, delayed by predetermined time intervals with respect to the system clock signal SCLK, are generated by the clock signal generator 20. Here, the data rate of the data input and output bus DIO BUS becomes a multiple of a conventional single data rate. Thus, the bandwidth representing the speed of data of a memory within the memory module 10 of FIG. 1 is improved.

Although the invention has been described with reference to a particular embodiment, it will be apparent to one of ordinary skill in the art that modifications of the described embodiment may be made without departing from the spirit and scope of the invention.

What is claimed is:

1. A semiconductor memory device, comprising:

a data bus line;

a clock signal generator for receiving a system clock signal and generating first and second clock signals;

a first set of synchronous memory devices connected to the data bus line for outputting first memory cell data to the data bus line in synchronization with the first clock signal; and a second set of clock synchronous memory devices connected to the data bus line for outputting second memory cell data to the data bus line in synchronization with the second clock signal.

2. A semiconductor memory device, as recited in claim 1, wherein the first and second clock signals are generated such that the first and second set of synchronous memory devices are not connected to the data bus line at the same time.

3. A semiconductor memory device, as recited in claim 1, wherein the first clock signal is substantially identical to the system clock signal, and wherein the second clock signal is delayed by a predetermined time interval with respect to the system clock signal.

4. A semiconductor memory device, as recited in claim 3, wherein the second clock signal is delayed by a predetermined time interval such that the second clock signal it is the inverse of the system clock signal.

5. A semiconductor memory device, as recited in claim 4, wherein the first and second sets of synchronous memory devices have a valid data window that is smaller than the predetermined time interval.

6. A semiconductor memory device, as recited in claim 1, further comprising an address/command driver for providing address and command signals to the first and second sets of synchronous memory devices.

7. A memory module, comprising:

a printed circuit board having an electrical connector including a data bus line;

a first set of synchronous memory devices arranged on the printed circuit board and connected to the data bus line;

a second set of synchronous memory devices arranged on the print circuit board and connected to the data bus line; and a clock signal generator electrically connected to the first and second set of synchronous memory devices, for receiving a system clock signal from the electrical connector and generating a first clock signal and a second clock signal, wherein first memory data in the first set of synchronous memory devices and second memory data in the second set of synchronous memory devices are alternately output to the data bus line.

8. A memory module, as recited in claim 7,
wherein the first clock signal is matched with the received clock signal, and
wherein the second clock signal is delayed with respect to the received clock signal for half the period of the received clock signal.

9. A memory module, as recited in claim 7, further comprising an address/command driver connected to a first and second sets of synchronous memory devices, for receiving a memory address of one of the first or second set of synchronous memory devices and a command for directing an operation mode of the one of the first or second set of synchronous memory devices, from the electrical connector.

10. A memory module, as recited in claim 9, wherein the address/command driver starts activating the memory devices before the first and second clock signals are generated.

11. A memory module, as recited in claim 7, wherein the synchronous memory devices have a valid data window that is smaller than half the period of the clock signal.

12. A memory module, as recited in claim 7, wherein the synchronous memory devices increase the data bandwidth of the memory module.

* * * * *